(12) United States Patent
Bratkovski et al.

(10) Patent No.: US 8,050,078 B2
(45) Date of Patent: Nov. 1, 2011

(54) NANOWIRE-BASED MEMRISTOR DEVICES

(75) Inventors: Alexandre M. Bratkovski, Palo Alto, CA (US); Viatcheslav Osipov, East Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 221 days.

(21) Appl. No.: 12/606,871

(22) Filed: Oct. 27, 2009

(65) Prior Publication Data
US 2011/0096589 A1    Apr. 28, 2011

(51) Int. Cl.
*G11C 11/00* (2006.01)
(52) U.S. Cl. ......... 365/129; 365/148; 365/151; 977/943
(58) Field of Classification Search .................. 365/129, 365/148, 151; 977/943
See application file for complete search history.

(56) References Cited

U.S. PATENT DOCUMENTS

| | | | |
|---|---|---|---|
| 6,636,433 B2* | 10/2003 | Tanikawa | 365/36 |
| 2010/0264397 A1* | 10/2010 | Xia et al. | 257/4 |
| 2011/0176353 A1* | 7/2011 | Li et al. | 365/148 |

OTHER PUBLICATIONS

Chua, "Memristor—The Missing Circuit Element," Sep. 1971, IEEE Transactions on Circuit Theory, vol. CT-18, No. 5, pp. 507-519.*
Strukov et al., "The missing memristor found," May 2008, Nature, vol. 453, pp. 80-83.*
Strukov, "Memristors and Their Applications," Oct. 2, 2008, presented at 2008-2009 Palo Alto Colloquia, 69 pages. Presentation slides avaialble at http://www.lockheedmartin.com/ssc/AdvancedTechnologyCtr/colloquia/20082009ColloquiaSchedule.html.*
Di Ventra et al., "Circuit element with memory: memristors, memcapacitors and meminductors," Oct. 2009, Proceedings of the IEEE, vol. 97, No. 10, pp. 1717-1724.*

* cited by examiner

*Primary Examiner* — Alexander Sofocleous

(57) ABSTRACT

Embodiments of the present invention are directed to memristor devices that provide nonvolatile memristive switching. In one embodiment, a memristor device includes a first electrode, a second electrode, and a nanowire disposed between the first electrode and the second electrode. The nanowire is configured with an inner region surrounded by an outer layer. The memristor device may also include a mobile dopant confined to the inner region by repulsive electrostatic forces between the outer layer and the mobile dopant. The resistance of the nanowire is determined by the distribution of the mobile dopant in the inner region.

17 Claims, 6 Drawing Sheets

NANOWIRE-BASED MEMRISTOR DEVICES

TECHNICAL FIELD

Embodiments of the present invention are related to nanoscale memristor devices.

BACKGROUND

Significant research and development efforts are currently directed towards designing and manufacturing nanoscale electronic devices, such as nanoscale memories. Nanoscale electronics promises significant advances, including considerably reduced features sizes and the potential for self-assembly and for other relatively inexpensive, non-photolithography-based fabrication methods. However, the design and manufacture of nanoscale electronic devices present many new challenges when compared with the current state-of-the-art.

Studies of switching in nanometer-scale transition-metal oxide devices have previously reported that these devices could be reversibly switched and had an "on-to-off" conductance ratio of approximately $10^4$. These devices have been used to construct crossbar circuits and provide a promising route for the creation of ultra-high density nonvolatile memory. A series connection of crossbar switches that can be used to fabricate, for example, latch circuit elements has also been demonstrated, which is an important component for logic circuits and for communication between logic and memory. New logic families that can be constructed entirely from crossbar arrays of resistive switches or as hybrid structures composed of resistive switches and transistors have been described. These new logic families have the potential to dramatically increase the computing efficiency of CMOS circuits, thereby enabling performance improvements of orders of magnitude without having to shrink transistors, or to even replace CMOS for some applications if necessary. However, it is desired to improve the performance of these devices especially in terms of reducing fatigue, operating current, and programmability.

DETAILED DESCRIPTION

Embodiments of the present invention are directed to memristor devices that provide nonvolatile memristive switching. A memristor device includes a nanoscale wire ("nanowire") configured with an outer layer and a mobile dopant confined to an inner region of the nanowire. In particular, the mobile dopant and the outer layer have the same effective charge resulting in repulsive electrostatic forces between the mobile dopant and the outer layer, effectively confining the mobile dopant to the inner region. The devices may also include electrodes disposed at the ends of the nanowires. The resistance state of a nanowire is determined by the way in which the mobile dopant is distributed within the inner region of the nanowire. When the mobile dopant is concentrated near one of the electrodes, the resistance of the nanowire is larger than when the mobile dopant is approximately evenly distributed throughout the inner region. The resistance state of a nanowire can be changed by redistributing the mobile dopant. Applying a series of voltage pulses with an appropriate polarity to the electrodes increases the temperature of the nanowire which, in turn, increases the diffusivity of the mobile dopant and produces a redistribution of the mobile dopant within the inner region of the nanowire. When the series of voltage pulses is discontinued, the temperature of the nanowire decreases, decreasing the diffusivity of the mobile dopant and effectively setting the distribution of the mobile dopant within the inner region.

I. Memristor Devices

Figure 1A:
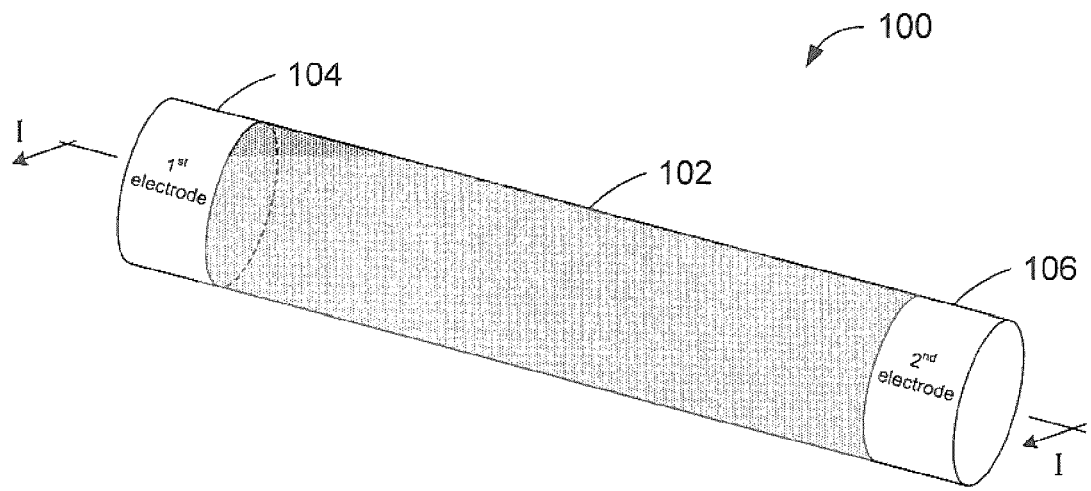
FIGS. 1A-1B show isometric and exploded isometric views of a memristor device configured in accordance with embodiments of the present invention.
Figure 1B:
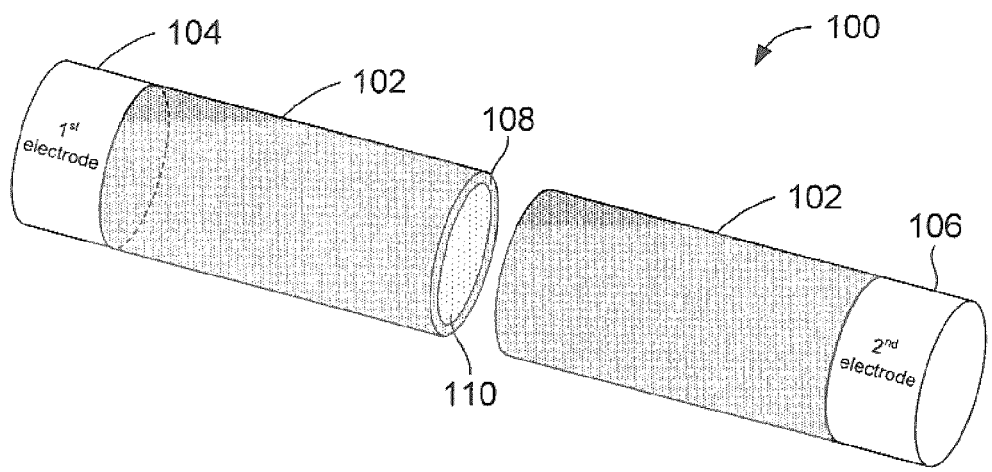

FIGS. 1A-1B show an isometric view and an exploded isometric view, respectively, of a memristor device 100 configured in accordance with embodiments of the present invention. The device 100 includes a nanowire 102 disposed between a first electrode 104 and a second electrode 106. As shown in the example of FIG. 1B, the nanowire 102 is severed in order to reveal an outer layer 108 and an inner region 110 of the nanowire 102.

Figure 2A:
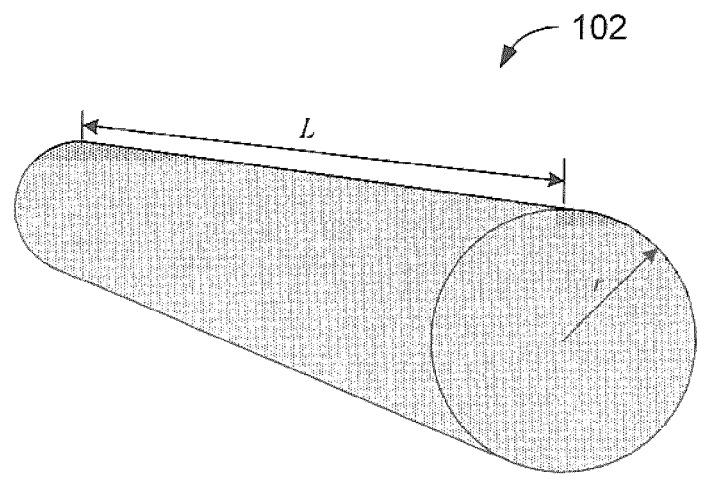
FIG. 2A-2B show perspective and cross-sectional views of a nanowire of a memristor device configured in accordance with embodiments of the present invention.
Figure 2B:
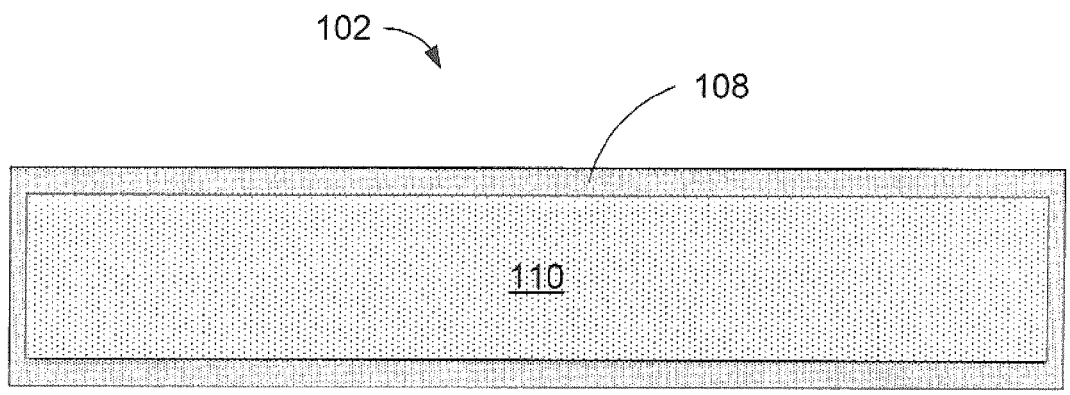

FIG. 2A shows a perspective view of the nanowire 102 configured in accordance with embodiments of the present invention. The length of the nanowire 102 L may range from about 20 nm to about 300 nm, and the radius r of the nanowire 102 may range from about 10 nm to about 100 nm. FIG. 2B shows a cross-sectional view of the nanowire 102 along the line I-I, shown in FIG. 1A, revealing that the inner region 110 spans the length of the nanowire 102 and is substantially surrounded by the outer layer 108.

Note that although the nanowire is shown in FIGS. 1 and 2 with a circular cross-section, in other embodiments, the nanowire can be configured with an elliptical, square, rectangular, triangular, or any other suitable cross-section geometry or suitable cross-sectional aspect ratio.

The nanowire 102 can be composed of an elemental and/or a compound semiconductor or semiconductor alloy. Elemental semiconductors include silicon ("Si") and germanium ("Ge"). Compound semiconductors include a silicon germanium alloy $Si_xGe_{1-x}$. The mobility of mobile dopants within the silicon germanium alloy strongly depends on the composition x of the alloy. Compound semiconductors also include group IV compound semiconductors, III-V compound semiconductors, and II-VI compound semiconductors. Group IV compound semiconductors include silicon germanium SiGe.

III-V compound semiconductors are composed of column IIIa elements selected from boron ("B"), aluminum ("Al"), gallium ("Ga"), and indium ("In") in combination with column Va elements selected from nitrogen ("N"), phosphorus ("P"), arsenic ("As"), and antimony ("Sb"). III-V compound semiconductors are classified according to the relative quantities of III and V elements, such as binary compound semiconductors, ternary compound semiconductors, and quaternary compound semiconductors. The nanowire 102 can be composed of other types of suitable compound semiconductors including II-VI ternary alloy semiconductors and II-V compound semiconductors.

In certain embodiments, the outer layer 108 of the nanowire 102 can be formed as a result of doping the nanowire 102 during nanowire formation with a suitable p-type impurity. P-type impurities are atoms that introduce vacant electronic energy levels called "holes" to the valence band gap of the nanowire. These dopants are also called "electron acceptors." For example, B, Al, and Ga are p-type dopants that introduce vacant electronic energy levels near the top of the valence band of the elemental semiconductors Si and Ge and the compound semiconductor SiGe. During formation of the nanowire 102, holes can migrate to the outer surface of nanowire 102 forming a positively charged, electron depleted, outer layer 108. In III-V compound semiconductors, column II elements substitute for column III atoms in the III-V lattice to form p-type dopants.

In other embodiments, the outer layer 108 of the nanowire 102 can be formed as result of lightly doping the nanowire 102 during nanowire formation with a suitable n-type impurity. N-type impurities are atoms that introduce filled electronic energy levels to the electronic band gap of the nanowire. These dopants are called "electron donors." For example, P, As, and Sb are n-type dopants that introduce filled electronic energy levels near the conduction band of the elemental semiconductors Si and Ge and the compound semiconductor SiGe. During formation of the nanowire 102, electrons can migrate to the outer surface of nanowire 102 forming a negatively charged, electron abundant, outer layer 108. In III-V compound semiconductors, column VI elements substitute for column V atoms in the III-V lattice and serve as n-type dopants. Note that holes produced as a result of p-type impurities and electrons produced as a result of n-type impurities can both be referred to in general as "charge carriers."

In still other embodiments, charge carriers can form the outer layer 108 as a result of the properties of the material selected for the nanowire 102. For example, surface hole states may form in the outer layer 108 naturally during formation of the nanowire 102 and not as a result of doping the nanowire with a p-type impurity. The holes can migrate to the outer surface of the nanowire 102 forming a positively charged, electron depleted, outer layer 108.

In certain embodiments, the electrodes 104 and 106 can both be composed of heavily doped n+-type semiconductors. In other embodiments, one electrode, such as electrode 104, can be composed of a heavily doped p+-type semiconductor and the other electrode, electrode 106, can be composed of a heavilty doped n+-type semiconductor. For heavy doping, the concentration of impurities can be on the order of about $10^{15}$ to about $10^{19}$ impurities/cm$^3$. In still other embodiments, at least one of the electrodes 104 and 106 can be configured to create at an ohmic contact at the electrode nanowire interface. An ohmic contact corresponds to a substantially linear current-voltage relationship. In order to create an ohmic contact, at least one of the electrodes 104 and 106 can be composed of a titanium ("Ti") based silicide or cobalt ("Co") based silicide. In other embodiments, at least one of the electrodes 104 and 106 can be composed of platinum ("Pt"), gold ("Au"), copper ("Cu"), tungsten ("W"), or any other suitable metal or metallic compound (e.g. some perovskites with or without dopants such as BaTiO$_3$ and Ba$_{1-x}$La$_x$TiO$_3$, PrCaMnO$_3$). At least one of the electrodes 104 and 106 can also be composed of metallic oxides or nitrides, such as RuO$_2$, IrO$_2$, and TiN. The electrodes 104 and 106 can also be composed of any suitable combination of these materials.

The nanowire 102 can also be configured to include one or more mobile dopants. A mobile dopant can be an atomic cation or anion and the type of ion is selected to have the same charge as the outer layer 108. Repulsive electrostatic forces between the outer layer 108 and the mobile dopant substantially confine the mobile dopant to the inner region 110. For example, in different embodiments, when the nanowire 102 is composed of a material that creates a positively charged outer layer 108, the mobile dopant can be, without limitation, a hydrogen ion ("H$^+$"), a lithium ion ("Li$^+$"), a sodium ion ("Na$^+$"), a beryllium ion ("Be$^{2+}$") or another suitable atomic cation. In other embodiments, when the nanowire 102 is composed of a material that creates a negatively charged outer layer 108, the mobile dopant can be, without limitation, a fluorine ion ("F$^-$"), a chlorine ion ("Cl$^-$"), or another suitable atomic anion.

Note that the p-type and n-type dopants described above for creating the charged outer layer 108 of the nanowire 102 are part of the material crystal lattice of the nanowire 102. In other words, p-type and n-type impurities for producing the outer layer 108 substitute for atoms comprising the bulk crystal lattice material of the nanowire 102. By contrast, mobile dopants are not strictly part of the crystal lattice material of the nanowire 102 and, as a result, under appropriate temperatures and applied electric field strength, mobile dopants can be selectively distributed within the nanowire 102 to effectively control the resistance of the nanowire 102.

Figure 3A:
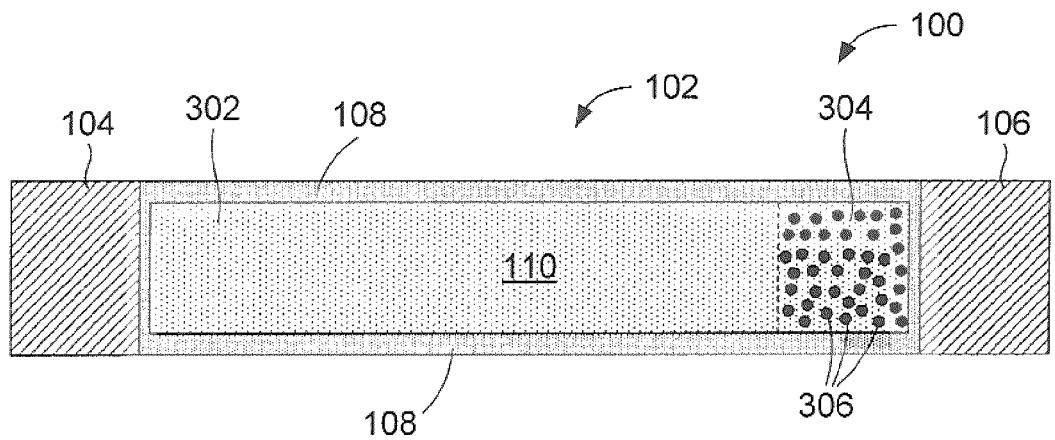
FIG. 3A shows a cross-sectional view of the memristor device along a line I-I, shown in FIG. 1A, in a first resistance state in accordance with embodiments of the present invention.
Figure 3B:
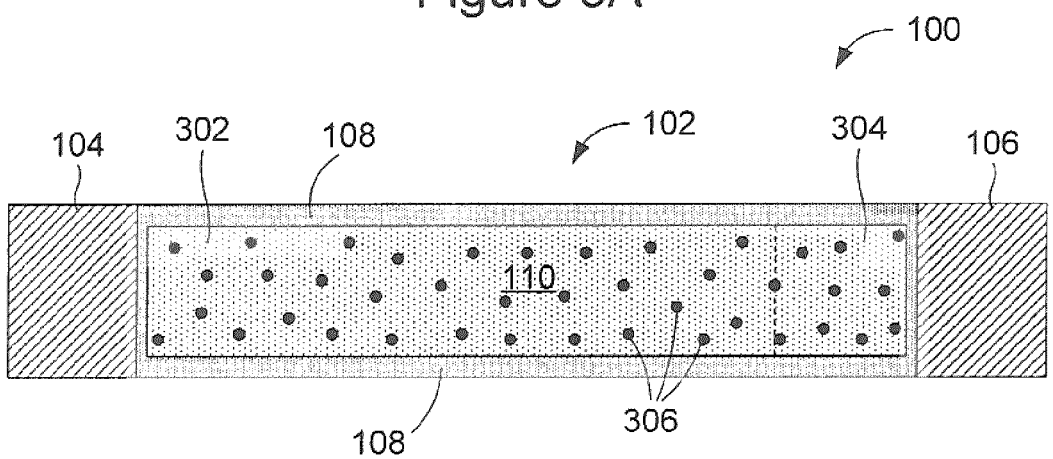
FIG. 3B shows a cross-sectional view of the memristor device along the line I-I, shown in FIG. 1A, in a second resistance state in accordance with embodiments of the present invention.

FIG. 3A shows a cross-sectional view of the memristor device 100 along a line I-I, shown in FIG. 1A, configured with a first resistance state in accordance with embodiments of the present invention. As shown in the example of FIG. 3A, the nanowire includes a primary sub-region 302 substantially free of mobile dopants and charge carriers and a secondary sub-region 304 that includes a mobile dopant, represented by dots 306, substantially confined to the inner region 110 adjacent to the second electrode 106. As a result, the primary sub-region 306 has a higher resistance than the secondary sub-region 304. FIG. 3B shows a cross-sectional view of the memristor device 100 along the line I-I, shown in FIG. 1A, configured with a second resistance state in accordance with embodiments of the present invention. As shown in the example of FIG. 3B, the mobile dopant 306 is distributed throughout the inner region 110. By distributing the mobile dopant throughout the inner region 110, as shown in FIG. 3B, the resistance associated with the second resistance state is lower than the resistance of the first resistance state, shown in FIG. 3A, because the distributed mobile dopant facilitates the flow of charge carriers through the nanowire 102 under appropriate applied biases.

The mobility $\mu_d$ and the diffusion constant D for a mobile dopant in the nanowire 102 lattice are related by the Einstein relation:

$$D = \mu_d kT = kT\mu_0 \exp(-\Delta/kT)$$

where k is Boltzmann's constant, and T is absolute temperature. Thus, if the mobility $\mu_d$ of a dopant in a lattice is high, so is the diffusion constant. D, $\Delta$ is an activation energy. The mobiltiy of the mobile dopant in the nanowire 102 is also determined by the temperature of the nanowire.

Figure 4:
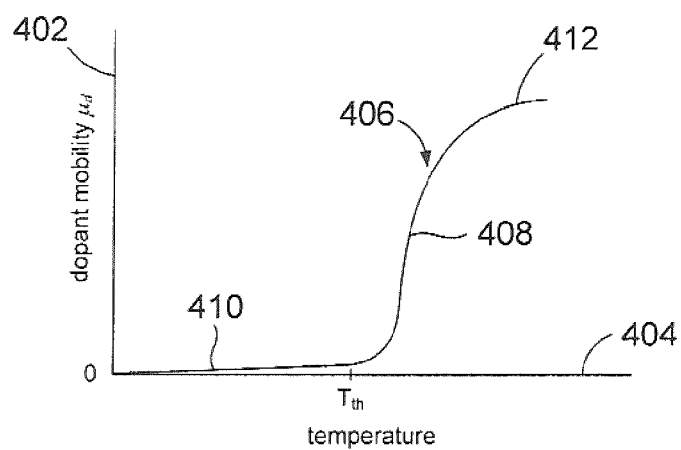
FIG. 4 shows an exemplary plot that hypothetically represents mobility of a mobile dopant in a nanowire as a function of temperature in accordance with embodiments of the present invention.

FIG. 4 shows an exemplary plot that hypothetically represents the mobility of a mobile dopant in the nanowire 102 as a function of temperature in accordance with embodiments of the present invention. Axis 402 represents the mobility $\mu_d$, orthogonal axis 404 represents temperature, and curve 406 represents $\mu_d$ as a function of the temperature. As shown in the plot of FIG. 4, curve 406 exponentially increases 408 at a threshold temperature $T_{th}$. Portion 410 of the curve 406 reveals that the mobility of the mobile dopant is approximately zero until the threshold temperature $T_{th}$ is reached, at which point the mobility of the mobile dopant exponentially increases from approximately zero mobility to a higher mobility represented by portion 412 of curve 406.

The device 100 is a memristor because the resistance of the nanowire 102 can be changed in a nonvolatile fashion by adjusting the temperature of the nanowire 102, as indicated by the plot shown in FIG. 4, and according to the magnitude and polarity of an electric field applied in the nanowire 102, as described below. Memristance is a nonvolatile, charge-dependent resistance denoted by M(q). The term "memristor" is short for "memory resistor." Memristors are a class of passive circuit elements that maintain a functional relationship between the time integrals of current and voltage, or charge and flux, respectively. This results in resistance varying according to the device's memristance function. Specifically engineered memristors provide controllable resistance useful for switching current. The definition of the memristor is based on fundamental circuit variables, similar to the resistor, capacitor, and inductor. Unlike those more familiar elements, the necessarily nonlinear memristors may be described by any of a variety of time-varying functions. As a result, memristors do not belong to Linear Time-Independent circuit models. A linear time-independent memristor is simply a conventional resistor.

A memristor is a circuit element in which the 'magnetic flux' (defined as an integral of bias voltage over time) $\Phi$ between the electrodes is a function of the amount of electric charge q that has passed through the device. Each memristor is characterized by its memristance function describing the charge-dependent rate of change of flux with charge as follows:

$$M(q) = \frac{d\Phi}{dq}$$

Based on Faraday's law of induction that magnetic flux $\Phi$ is the time integral of voltage, and charge q is the time integral of current, the memristance can be written as $$M(q) = \frac{V}{I}$$

Thus, as stated above, the memristance is simply nonvolatile charge-dependent resistance. When M(q) is constant, the memristance reduces to ohm's Law R=V/I. When M(q) is not constant, the equation is not equivalent to ohm's Law because g and M(q) can vary with time. Solving for voltage as a function of time gives:

$$V(t) = M[q(t)]I(t)$$

This equation reveals that memristance defines a linear relationship between current and voltage, as long as charge does not vary. However, nonzero current implies instantaneously varying charge. Alternating current may reveal the linear dependence in circuit operation by inducing a measurable voltage without net charge movement, as long as the maximum change in q does not cause change in M. Furthermore, the memristor is static when no current is applied. When I(t) and V(t) are 0, M(t) is constant. This is the essence of the memory effect.

The basic mode of operation for selecting a resistance state for the memristor device 100 is to heat the nanowire 102 above an associated threshold temperature by applying a series of voltage pulses across the nanowire 102. The voltage pulses also generate an electric field, also called a "drift field," across the nanowire 102. When the nanowire 102 exceeds the threshold temperature, depending on the initial resistance state of the nanowire and the magnitude and polarity of the drift field, the mobile dopant can either drift into the primary sub-region 302 from the secondary sub-region 304 or drift into the secondary sub-region 304 from the primary sub-region 302.

Figure 5A:
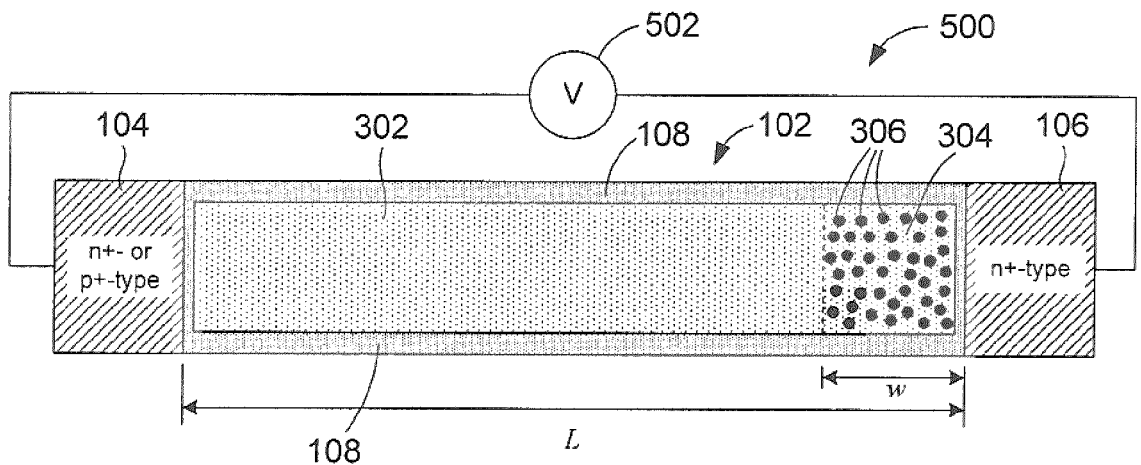
FIGS. 5A-5C show cross-sectional views of a memristor device configured and operated in accordance with embodiments of the present invention.
Figure 5B:
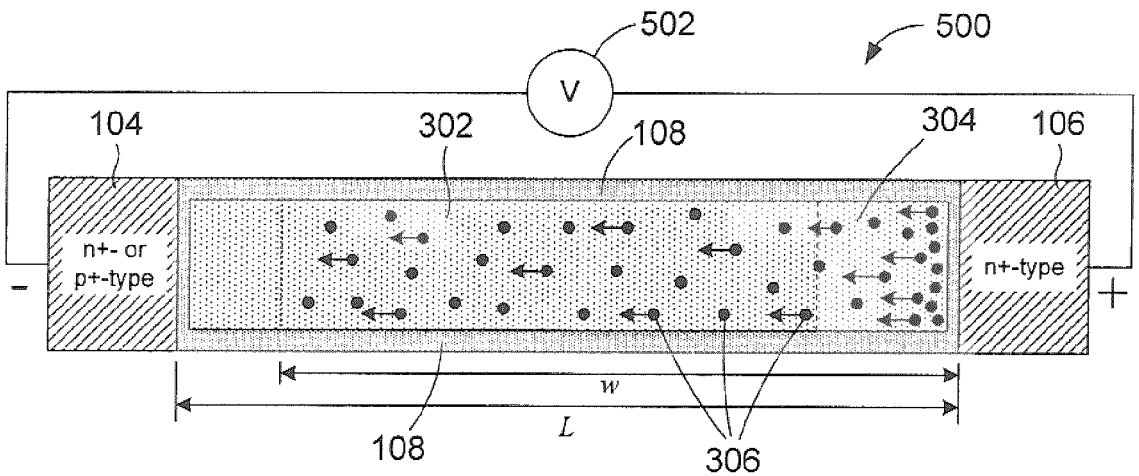
Figure 5C:
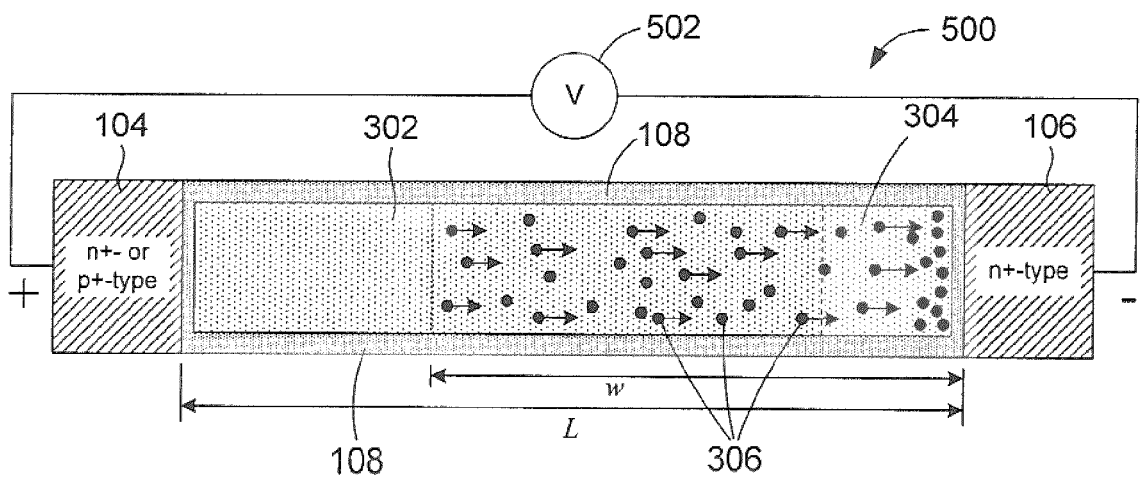

The mobile dopant can be specifically chosen to produce charge carriers in to the primary sub-region 302, thereby changing the resistance of the nanowire 102. FIGS. 5A-5C show cross-sectional views of a memristor device 500 configured and operated in accordance with embodiments of the present invention. As shown in the example of FIGS. 5A-5C, the electrode 106 is highly doped with an n-type impurity, and the electrode 104, in certain embodiments, can be highly doped with an n-type impurity, and, in other embodiments, can be highly doped with a p-type impurity. FIGS. 5A-5C show a voltage source 502 electronically coupled to the electrodes 104 and 106. In this hypothetical example, the outer layer 108 and the mobile dopant 306 are composed of positively charged materials.

FIG. 5A shows that, initially, when no voltage is applied to the nanowire 102, the mobile dopants are confined to the secondary sub-region 304 near the n+-type electrode 106. The parameter w is a state variable that specifies the extent to which the mobile dopant is distributed within the inner region 110.

FIG. 5B shows a snapshot of when the voltage source 502 is operated to apply a series of voltage pulses with the positive voltage applied to the n+-type electrode 106. The series of voltage pulses increases the temperature of the nanowire 102 above the threshold temperature. As a result, the mobility of the mobile dopant increases exponentially, and the drift field associated with the series of voltage pulses causes the mobile dopants 306 to drift from the secondary sub-region 304 into the primary sub-region 302, as indictated by the increased length in w, lowering the resistance of the nanowire 102. In certain embodiments, the duration of the series of voltage pulses may be used to distribute the mobile dopants in the inner region 110 to produce a desired total resistance of the device. In other embodiments, the series of voltage pulses may be used to drive the mobile dopants into a third sub-region (not represented) of the inner region 110 adjacent to the electrode 104 leaving the remainder of the inner region 110 substantially free of mobile dopants and charge carriers.

FIG. 5C shows a snapshot of when the voltage source 502 is operated to drive the mobile dopants 306 toward the n+-type electrode 106. The voltage source 502 is operated to apply a series of voltage pulses with the negative voltage applied to the n+-type electrode 106. The series of voltage pulses can also be used to increase the temperature of the nanowire 102 above the threshold temperature. As shown in FIG. 5C, the mobility of the mobile dopant increases exponentially and the drift field associated with the series of voltage pulses causes the mobile dopants 306 to drift from the primary sub-region 302 toward the n+-type electrode 106, as indictated by the decreased length in w, increasing the resistance of the nanowire 102.

The nanowire 102 material and the mobile dopants can be selected so that drift of a mobile dopant into or out of the primary sub-region 302 is possible but not too facile that mobile dopants can diffuse into or out of the primary sub-region 302 when no voltage is applied. Some diffusion resistance is required to ensure that the nanowire 102 remains in a particular resistance state for a reasonable period of time, perhaps for many years over a range of operating temperatures. This ensures that the nanowire 102 is nonvolatile, as described above, because the nanowire 102 retains its resistance state even after the drift field has been removed. Applying a drift field with a large enough magnitude may produce an electron current and cause dopants to drift, whereas applying operating voltages with lower relative voltage magnitudes than the voltages used to create the drift field causes negligible dopant drift enabling the device to retain its resistance state during operation.

The nanowire 102 material can be single crystalline, alloy (e.g. $Si_xGe_{1-x}$), poly-crystalline, nanocrystalline, nanoporous, or amorphous. The mobility of the mobile dopants in nanocrystalline, nanoporous or amorphous materials, however, is typically higher than in bulk crystalline material, since drift can occur through grain boundaries, pores or through local structural imperfections in a nanocrystalline, nanoporous, or amorphous material. Also, the amount of time needed for mobile dopants to drift into or out of the primary sub-region 302 enables the primary sub-region 302 conductivity to be rapidly changed. For example, the time needed for drift varies as the square of the distance covered, so the time for a. mobile dopant to drift one nanometer can be one-millionth of the time for the mobile dopant to drift one micrometer.

The ability of a mobile dopant to drift in and out of the primary sub-region 302 may be improved if one of the interfaces connecting the nanowire 102 to the electrodes is non-covalently bonded. Such an interface may be composed of a material that does not form covalent bonds with the adjacent electrode, the nanowire 102 material, or both. This non-covalently bonded interface may lower the activation energy of the atomic rearrangements for drift of the dopants in the primary sub-region.

In general, it is desired for the nanowire 102 of the device 100 to maintain a particular resistance state for an amount of time that may range from a fraction of a second to years, depending on the application. Thus, it is desired that the diffusion constant D of the nanowire 102 be low enough to ensure a level of stability, in order to avoid inadvertently turning the nanowire 102 from one resistance state to another resistance state via ionized mobile dopant diffusion, rather than by intentionally setting the resistance state of the nanowire 102 with an appropriate series of voltage pulses. Therefore, the mobility $\mu_d$ and the diffusion constant D should be small enough to ensure the stability or non-volatility of the nanowire 102 for as long as necessary under the desired conditions. Note that this relation breaks down at high field and the mobility becomes exponentially dependent on the field.

Figure 6:
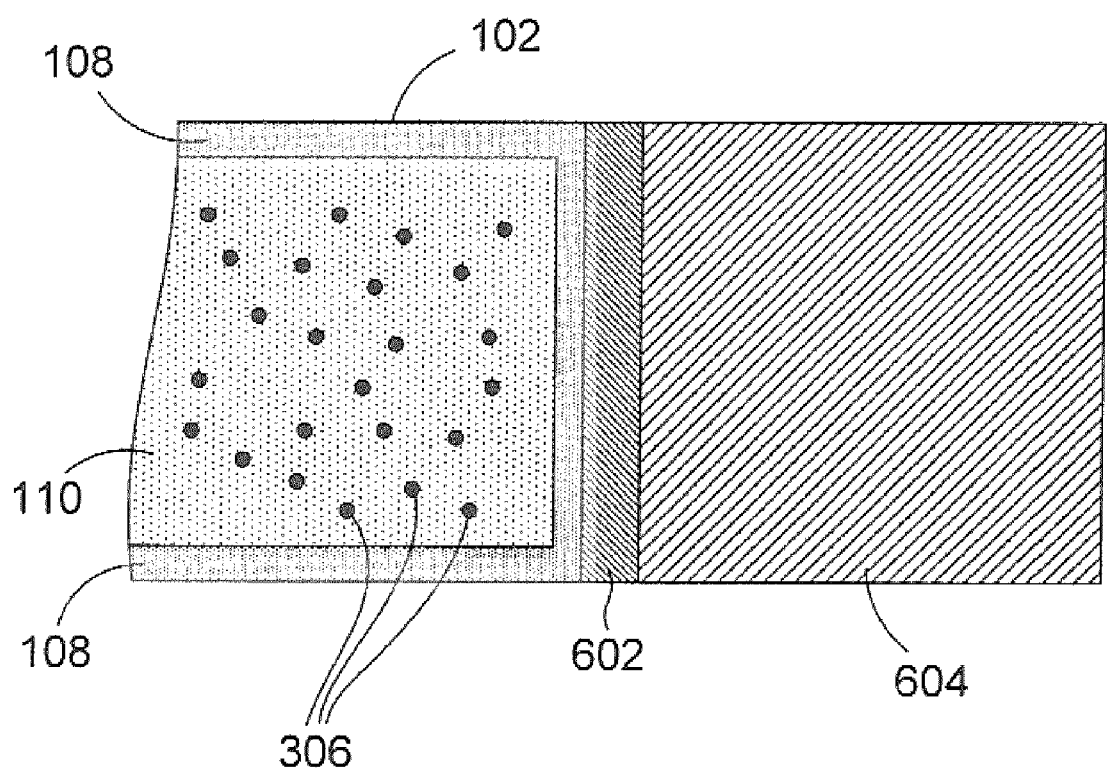
FIG. 6 shows an enlarged cross-sectional view of an example nanowire/electrode interface configured in accordance with embodiments of the present invention.

In other embodiments, memristor devices can include blocking layers disposed between the nanowire 102 and the electrodes to prevent the mobile dopant from drifting or diffusing into one or both of the electrodes. FIG. 6 shows an enlarged cross-sectional view of an example nanowire/electrode interface configured in accordance with embodiments of the present invention. As shown in the example of FIG. 6, a blocking layer 602 is disposed between the nanowire 102 and an electrode 604. The blocking layer 602 substantially prohibits mobile dopant 306 from drifting and/or diffusing into the electrode 604. The blocking layer can be composed of $SiO_2$, $Al_2O_3$, or another suitable insulting material.

II. Memristor Device Operation

Figure 7:
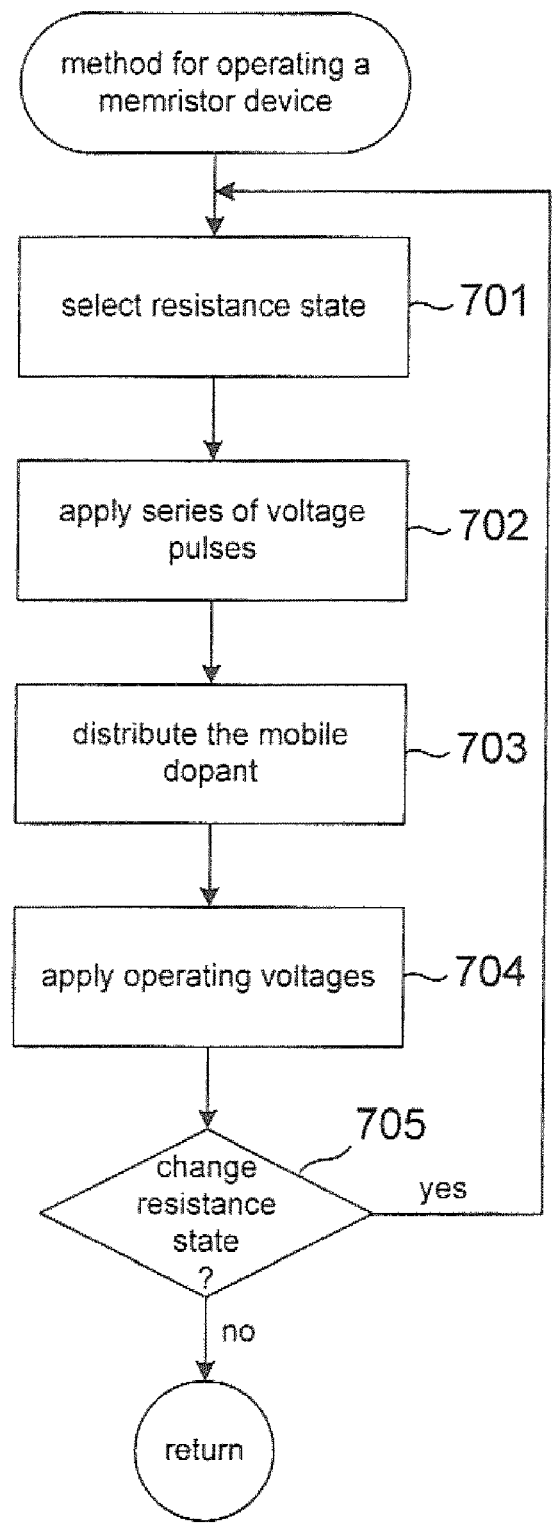
FIG. 7 shows a control-flow diagram of a method for changing the resistance state of a memristor device in accordance with embodiments of the present invention.

FIG. 7 shows a control-flow diagram of a method for changing the resistance state of a memristor device in accordance with embodiments of the present invention. In step 701, a resistance state for a memristor device is selected. The resistance state can be a high-resistance state or a low-resistance state. In step 702, a series of voltage pulses are applied to the memristor device in order to increase the temperature of the nanowire above a threshold temperature. The series of voltage pulses may also create a drift field, and the duration over which the series of voltage pulses are applied redistributes the mobile dopants in accordance with the selected resistance state, as described above with reference to FIGS. 5A-5C. In step 703, the mobile dopant is distributed according to the magnitude and polarity of a drift field created by the series of voltage pulses. In step 704, operating voltages can then be applied to the memristor device. The magnitude and polarity of the operating voltages are applied do not increase the temperature of the nanowire above the threshold temperature. In step 705, when a change in the resistance state of the memristor device is desired, steps 701-703 are repeated. Otherwise, the memristor device can continue to be operated using the operating voltages.

III. Example Implementations

In a first exemplary memristor device implementation, the mobile dopant can be $Li^+$ ion and the nanowire can be composed of Si doped with a p-type impurity, such as B, forming a positively charged depletion outer layer. The electrodes can both be n+-type semiconductors. Prior to heating the nanowire, the mobile dopant concentration in the secondary sub-region can range from about $1\times10^{14}$ dopants/cm$^3$ to about $5\times10^{14}$ dopants/cm$^3$. In order to drive the $Li^+$ ions into the primary sub-region of the Si nanowire, a series of voltage pulses can be used to heat the nanowire above a threshold temperature ranging from about 450 K to about 550 K by applying a positive voltage to the electrode adjacent to the second sub-region, causing the $Li^+$ ion mobility to increase to approximately $10^{-10}$ cm$^2$/Vs. The $Li^+$ ion can then drift under an applied drift field of about $10^5$ to about $10^6$ V/cm. The estimated switching time is about 20 ms. When the nanowire is cooled to room temperature, the diffusion coefficient of $Li^+$ ion in the Si nanowire is less than $10^{-15}$ cm/sec. Thus, the storage or memory time of the changed resistance is greater than $10^3$ sec.

In a second exemplary memristor device implementation, the mobile dopant and nanowire composition can be the same, but one electrode can be an n+-type electrode and the other electrode can be a p+-type electrode. The mobile dopant concentration can range from about $1\times10^{14}$ dopants/cm$^3$ to about $5\times10^{14}$ dopants/cm$^3$. Initially, the $Li^+$ ion mobile dopant can be located near the n+-type electrode. A series of voltage pulses are applied to the memristor device with the positive voltage applied to the n+-type electrode. The nanowire of the memristor device can be heated to about 400 K to about 500 K, driving the $Li^+$ ion toward the p+-type electrode. As a result, the pn-junction of the memristor device becomes more diffuse and the nanowire resistance decreases. The nanowire can be cooled to room temperature. The diffusion coefficient of Li$^+$ ion in the Si nanowire is less than $10^{-15}$ cm/sec, and the storage or memory time of the changed resistance is greater than $10^3$ sec.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A memristor device comprising:
a first electrode;
a second electrode;
a nanowire disposed between the first electrode and the second electrode, wherein the nanowire includes an inner region surrounded by an outer layer; and
a mobile dopant confined to the inner region by repulsive electrostatic forces between the outer layer and the mobile dopant, wherein resistance of the nanowire is determined by the distribution of the mobile dopant in the inner region.

2. The memristor device of claim 1 wherein the first electrode further comprises a heavily doped n-type semiconductor and the second electrode further comprises a heavily doped n-type semiconductor.

3. The memristor device of claim 1 wherein the first electrode further comprises a heavily doped n-type semiconductor and the second electrode further comprises a heavily doped p-type semiconductor.

4. The memristor device of claim 1 wherein the outer layer further comprises positively charged, electron depletion, region of the nanowire, and wherein the mobile dopant further comprises an atomic cation.

5. The memristor device of claim 1 wherein the outer layer further comprises negatively charged, electron abundant, region of the nanowire, and wherein the mobile dopant further comprises an atomic anion.

6. The memristor device of claim 1 wherein resistance of the nanowire is determined by the distribution of the mobile dopant in the inner region further comprises when the mobile dopant is concentrated near one of the electrodes the resistance of the nanowire is larger than when the mobile dopant is approximately evenly distributed throughout the inner region.

7. The memristor device of claim 1 wherein the resistance of the nanowire can be changed by application of a series of voltage pulses to the first and second electrodes, the series of voltage pulse increasing the nanowire temperature above a threshold temperature enabling redistribution of the mobile dopant within the inner region.

8. The memristor device of claim 1 wherein the resistance of the nanowire remains substantially unchanged for operating voltages applied to the first and second electrodes.

9. The memristor device of claim 1 further comprising:
a first blocking layer separating the first electrode from the nanowire; and
a second blocking layer separating the second electrode from the nanowire, wherein the first and second blocking layers substantially prohibit the mobile dopant from drifting and/or diffusing into the first and second electrodes.

10. A method for operating a memristor device comprising a nanowire disposed between a first electrode and a second electrode, the nanowire including a mobile dopant confined to an inner region of the nanowire, the method comprising:
selecting a resistance state for the memristor device;
applying a series of voltage pulses to the first and second electrodes, the series of voltage pulses heating the nanowire above a threshold temperature enabling the mobile dopant to drift within the nanowire;
distributing the mobile dopant within the nanowire to produce the resistance state; and
applying an operating voltage to the nanowire.

11. The method of claim 10 wherein the nanowire includes an outer layer surrounding the inner region such that the mobile dopant is confined to the inner region by repulsive electrostatic forces between the outer layer and the mobile dopant.

12. The method of claim 11 wherein the outer layer further comprises positively charged, electron depletion, region of the nanowire, and wherein the mobile dopant further comprises an atomic cation.

13. The method of claim 11 wherein the outer layer further comprises negatively charged, electron abundant, region of the nanowire, and wherein the mobile dopant further comprises an atomic anion.

14. The method of claim 10 wherein distributing the mobile dopant within the nanowire to produce the resistance state further comprises distributing the mobile dopant according to the magnitude and polarity of a drift field produced by the series of applied voltages.

15. The method of claim 10 wherein distributing the mobile dopant within the nanowire further comprises driving the mobile dopant toward one of the two electrodes to increase the resistance of the nanowire.

16. The method of claim 10 wherein distributing the mobile dopant within the nanowire further comprises approximately evenly distributing the mobile dopant throughout the nanowire to lower the resistance of the nanowire.

17. The method of claim 10 wherein applying an operating voltage to the nanowire further comprises leaving the mobile dopant substantially unchanged.

* * * * *